United States Patent
Lin et al.

(10) Patent No.: US 9,768,283 B1
(45) Date of Patent: Sep. 19, 2017

(54) HIGH-VOLTAGE SEMICONDUCTOR STRUCTURE

(71) Applicant: Vanguard International Semiconductor Corporation, Hsinchu (TW)

(72) Inventors: Shin-Cheng Lin, Tainan (TW); Wen-Hsin Lin, Jhubei (TW); Yu-Hao Ho, Keelung (TW); Yu-Lung Chin, Tainan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/075,726

(22) Filed: Mar. 21, 2016

(51) Int. Cl.
| | |
|---|---|
| *H01L 29/78* | (2006.01) |
| *H01L 29/66* | (2006.01) |
| *H01L 29/06* | (2006.01) |
| *H01L 29/739* | (2006.01) |
| *H01L 23/535* | (2006.01) |
| *H01L 29/10* | (2006.01) |

(Continued)

(52) U.S. Cl.
CPC ........ *H01L 29/7393* (2013.01); *H01L 23/535* (2013.01); *H01L 29/0634* (2013.01); *H01L 29/0649* (2013.01); *H01L 29/0684* (2013.01); *H01L 29/086* (2013.01); *H01L 29/0878* (2013.01); *H01L 29/1079* (2013.01); *H01L 29/1095* (2013.01); *H01L 29/36* (2013.01); *H01L 29/66659* (2013.01); *H01L 29/66681* (2013.01); *H01L 29/7816* (2013.01); *H01L 29/7835* (2013.01)

(58) Field of Classification Search
CPC ............. H01L 29/7835; H01L 29/7816; H01L 29/0653; H01L 29/7436; H01L 29/66659; H01L 29/66681; H01L 29/0878; H01L 29/086; H01L 29/1095; H01L 29/0634
See application file for complete search history.

(56) References Cited

U.S. PATENT DOCUMENTS 6,144,070 A * 11/2000 Devore ................... H01L 23/60
257/343
6,720,624 B1 * 4/2004 Vashchenko ........ H01L 27/0262
257/141

(Continued)

FOREIGN PATENT DOCUMENTS

| TW | 201505174 A | 2/2015 |
|---|---|---|
| TW | 201507152 A | 2/2015 |

*Primary Examiner* — Marvin Payen
*Assistant Examiner* — Jeremy Joy
(74) *Attorney, Agent, or Firm* — Birch, Stewart, Kolasch & Birch, LLP

(57) ABSTRACT

A high-voltage semiconductor structure including a substrate, a first doped region, a well, a second doped region, a third doped region, a fourth doped region, and a gate structure is provided. The substrate has a first conductive type. The first doped region has the first conductive type and is formed in the substrate. The well has a second conductive type and is formed in the substrate. The second doped region has the second conductive type and is formed in the first doped region. The third doped region has the first conductive type and is formed in the well. The fourth doped region has the second conductive type and is formed in the well. The gate structure is disposed over the substrate and partially covers the first doped region and the well.

14 Claims, 10 Drawing Sheets

(51) Int. Cl.
*H01L 29/36* (2006.01)
*H01L 29/08* (2006.01)

(56) References Cited

U.S. PATENT DOCUMENTS

| | | | | |
|---|---|---|---|---|
| 8,283,727 B1* | 10/2012 | Walker | ............... | H01L 29/0649 257/355 |
| 8,735,997 B2* | 5/2014 | Hachiyanagi | ....... | H01L 27/0722 257/328 |
| 2001/0025961 A1* | 10/2001 | Nakamura | .......... | H01L 29/7393 257/107 |
| 2005/0073007 A1* | 4/2005 | Chen | ................... | H01L 29/1083 257/355 |
| 2005/0179087 A1* | 8/2005 | Lin | .................... | H01L 27/0266 257/356 |
| 2006/0043487 A1* | 3/2006 | Pauletti | ............... | H01L 27/0262 257/355 |
| 2006/0186467 A1* | 8/2006 | Pendharkar | ........... | H01L 27/088 257/337 |
| 2007/0034956 A1* | 2/2007 | Lee | .................... | H01L 27/0262 257/355 |
| 2009/0315113 A1* | 12/2009 | Vashchenko | ........ | H01L 27/0262 257/355 |
| 2011/0260287 A1* | 10/2011 | Lee | .................... | H01L 23/5256 257/529 |
| 2013/0207184 A1* | 8/2013 | Chen | ................... | H01L 29/7835 257/339 |
| 2013/0334600 A1* | 12/2013 | Hsu | ................... | H01L 29/66681 257/337 |
| 2014/0027811 A1* | 1/2014 | Chen | ................... | H01L 29/7436 257/137 |
| 2014/0284720 A1* | 9/2014 | Chen | ...................... | H01L 29/78 257/355 |
| 2015/0228771 A1* | 8/2015 | Chen | ................... | H01L 29/7432 257/173 |
| 2016/0043216 A1* | 2/2016 | He | ...................... | H01L 29/7816 257/328 |

* cited by examiner

HIGH-VOLTAGE SEMICONDUCTOR STRUCTURE

BACKGROUND OF THE INVENTION

Field of the Invention

The invention relates to a semiconductor structure, and more particularly to a high-voltage semiconductor structure.

Description of the Related Art

High-voltage semiconductor devices are applied in integrated circuits with high voltage and high power. Traditional high-voltage semiconductor devices, such as a vertically diffused metal oxide semiconductor (VDMOS) or a laterally diffused metal oxide semiconductor (LDMOS), are mainly used for devices that operate on 18 volts or higher. The advantages of high-voltage device technology include cost effectiveness and process compatibility. High-voltage device technology has been used widely in display driver IC devices and power supply devices, as well as such fields as power management, communications, autotronics, and industrial control, among others.

BRIEF SUMMARY OF THE INVENTION

In accordance with an embodiment, a high-voltage semiconductor structure comprises a substrate, a first doped region, a well, a second doped region, a third doped region, a fourth doped region, and a gate structure. The substrate has a first conductive type. The first doped region has the first conductive type and is formed in the substrate. The well has a second conductive type and is formed in the substrate. The second doped region has the second conductive type and is formed in the first doped region. The third doped region has the first conductive type and is formed in the well. The fourth doped region has the second conductive type and is formed in the well. The gate structure is disposed over the substrate and partially covers the first doped region and the well.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
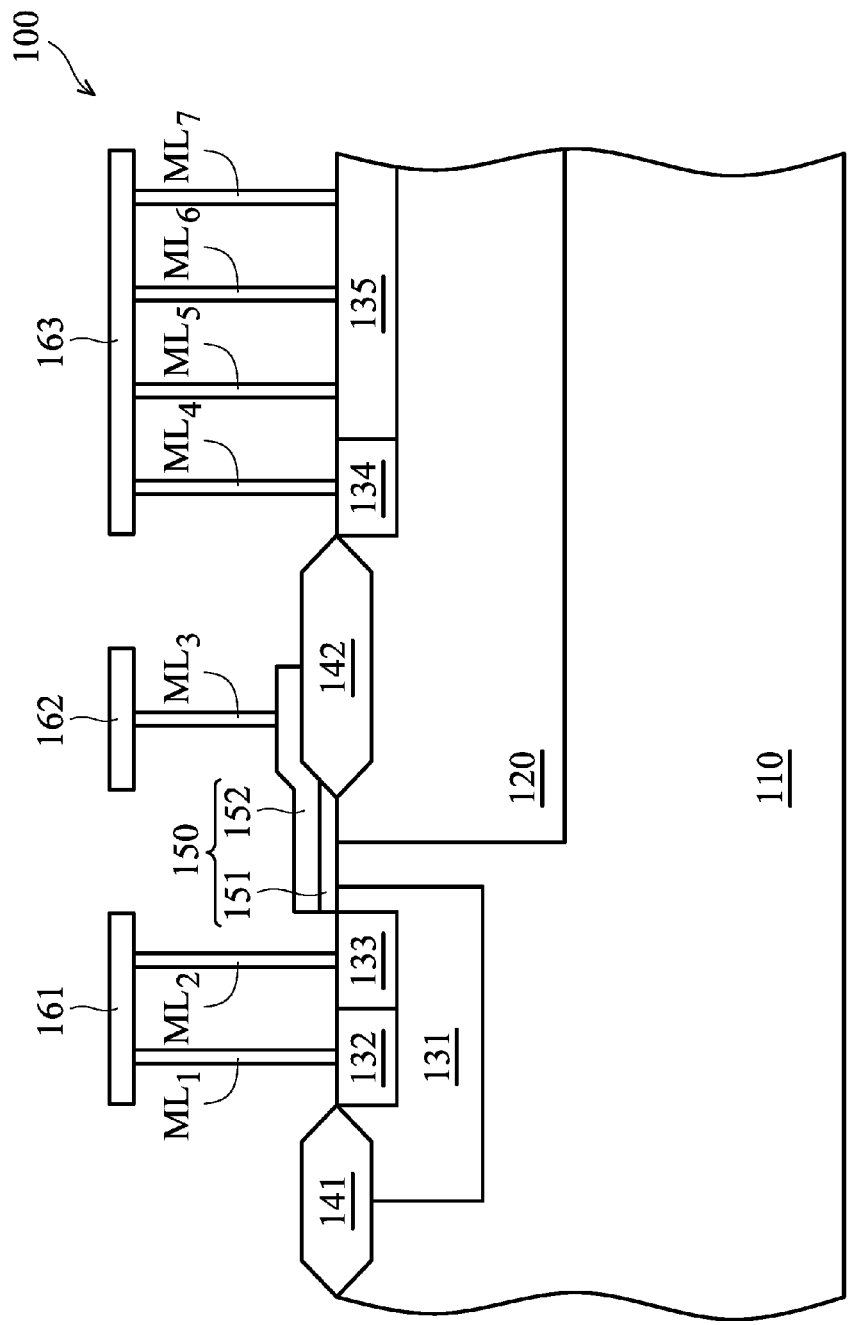
FIG. 1 is a schematic diagram of a high-voltage semiconductor structure according to an embodiment of the present invention.

FIG. 1 is a schematic diagram of a high-voltage semiconductor structure according to an embodiment of the present invention. The high-voltage semiconductor structure 100 comprises a substrate 110, a well 120, doped regions 131~135, insulating layers 141~142 and a gate structure 150. The substrate 110 has a first conductive type. In one embodiment, the substrate 110 may include, but is not limited to, a semiconductor substrate such as a silicon substrate. In addition, the semiconductor substrate may include an element semiconductor which may include germanium; compound semiconductor which may include silicon carbide, gallium arsenide, gallium phosphide, indium phosphide, indium arsenide and/or indium antimonide, alloy semiconductor which may include SiGe alloy, GaAsP alloy, AlInAs alloy, AlGaAs alloy, GaInAs alloy, GaInP alloy and/or GaInAsP alloy, or a combination thereof. In addition, the substrate 110 may include semiconductor-on-insulator. In one embodiment, the substrate 110 may be an un-doped substrate. However, in other embodiments, the substrate 110 may be a lightly doped substrate such as a lightly doped P-type substrate or a lightly doped N-type substrate.

The well 120 has a second conductive type and is formed in the substrate 110. In this embodiment, the first conductive type is different from the second conductive type. In one embodiment, the well 120 may be formed by ion implantation. For example, when the second conductive type is N-type, the predetermined region for the well 120 may be implanted with phosphorous ions or arsenic ions to form the well 120. However, when the second conductive type is P-type, the predetermined region for the well 120 may be implanted with boron ions or indium ions to form the well 120.

The doped region 131 has the first conductive type and is formed in the substrate 110. In this embodiment, the dopant concentration of the doped region 131 is higher than the dopant concentration of the substrate 110. In one embodiment, the doped region 131 is formed by doping P-type dopants to form a P-type doped region. In this case, the doped region 131 serves as a PBODY. In another embodiment, the doped region 131 is formed by doping N-type dopants. In this case, the doped region 131 serves as an NBODY.

The doped region 132 has the first conductive type and is formed in the doped region 131. The doped region 133 has the second conductive type and is formed in the doped region 131. In one embodiment, the doped region 132 is formed by doping P-type dopants, and the doped region 133 is formed by doping N-type dopants. In this case, the doped region 132 is a P+ doped region, and the doped region 133 is an N+ doped region. In another embodiment, the doped region 132 is formed by doping N-type dopants, and the doped region 133 is formed by doping P-type dopants. In this case, the doped region 132 is an N+ doped region, and the doped region 133 is a P+ doped region. The P-type dopants comprise boron, gallium, aluminum, indium, or combinations thereof. The N-type dopants comprise phosphorus, arsenic, nitrogen, antimony, or combinations thereof.

In other embodiments, the doped regions 132 and 133 are formed by performing a doping process with a patterned mask (not shown). Additionally, the dopant concentration can be varied according to manufacturing processes and device characteristics. In this embodiment, the doped regions 131 and 132 are formed by doping dopants with the first conductive type, wherein the dopant concentration of the doped region 132 is higher than the dopant concentration of the doped region 131.

The doped region 134 has the first conductive type and is formed in the well 120. In one embodiment, the dopant concentration of the doped region 134 is similar to the dopant concentration of the doped region 132. In this case, the doped region 134 is a P+ doped region or an N+ doped region. The doped region 135 has the second conductive type and is formed in the well 120. In one embodiment, the dopant concentration of the doped region 135 is higher than the dopant concentration of the well 120. For example, the doped region 135 is an N+ doped region or a P+ doped region.

The gate structure 150 is formed over the substrate 110 and partially covers the doped region 131 and the well 120. The gate structure 150 comprises a gate dielectric layer 151 and a gate electrode 152. In one embodiment, a dielectric material layer (not shown, for forming the gate dielectric layer 151) and a conductive material layer (not shown, for forming the gate electrode 152) thereon may be blanketly deposited over substrate 110 sequentially. Subsequently, the gate dielectric layer 151 and the gate electrode 152 are respectively formed from the dielectric material layer and the conductive material layer by patterning the above two layers through another photolithography and etch steps.

The material of the dielectric material layer (i.e. the material of the gate dielectric layer 151) may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof. The dielectric material layer may be formed by the previously described chemical vapor deposition or spin-on coating.

The material of the conductive material layer (i.e. the material of the gate electrode 152) may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by the previous described chemical vapor deposition (CVD), sputtering, resistive thermal evaporation, electron beam evaporation, or any other suitable methods. For example, in one embodiment, the amorphous silicon conductive material layer or poly-silicon conductive material layer may be deposited and formed by low-pressure chemical vapor deposition at about 525° C.~650° C. The thickness of the amorphous silicon conductive material layer or poly-silicon conductive material layer may range from about 1000 Å to 10000 Å.

The insulating layer 141 is formed in the substrate 110. In this embodiment, the insulating layer partially covers the substrate 110 and the doped region 131. The insulating layer 142 is formed in the well 120 and between the doped regions 133 and 134. In one embodiment, the conductive type is P-type, and the second conductive type is N-type. In another embodiment, the first conductive type is N-type, and the second conductive type is P-type.

In one embodiment, the doped regions 132 and 133 are coupled to the power line 161 via the metal conductive lines $ML_1$~$ML_2$, the gate electrode 152 is coupled to the power line 162 via the metal conductive line $ML_3$, and the doped regions 134 and 135 are coupled to the power line 163 via the metal conductive lines $ML_4$~$ML_7$. When voltages are applied to the power lines 161~163 and the voltage applied to the power line 161 is higher than the voltage applied to the power line 163, a current flows from the doped region 132, the doped region 133, the doped region 131, the well 120, and the doped region 135 to the power line 163. Since the voltage level of the doped region 135 is increased, the voltage difference between the doped region 134 and the well 120 is increased. When the voltage difference between the doped region 134 and the well 120 arrives to the turn-on voltage of the PN junction between the doped regions 134 and 120, an insulated gate bipolar transistor (IGBT) constituted by the doped regions 132 and 134 and the gate electrode 152 is triggered.

Figure 2A:
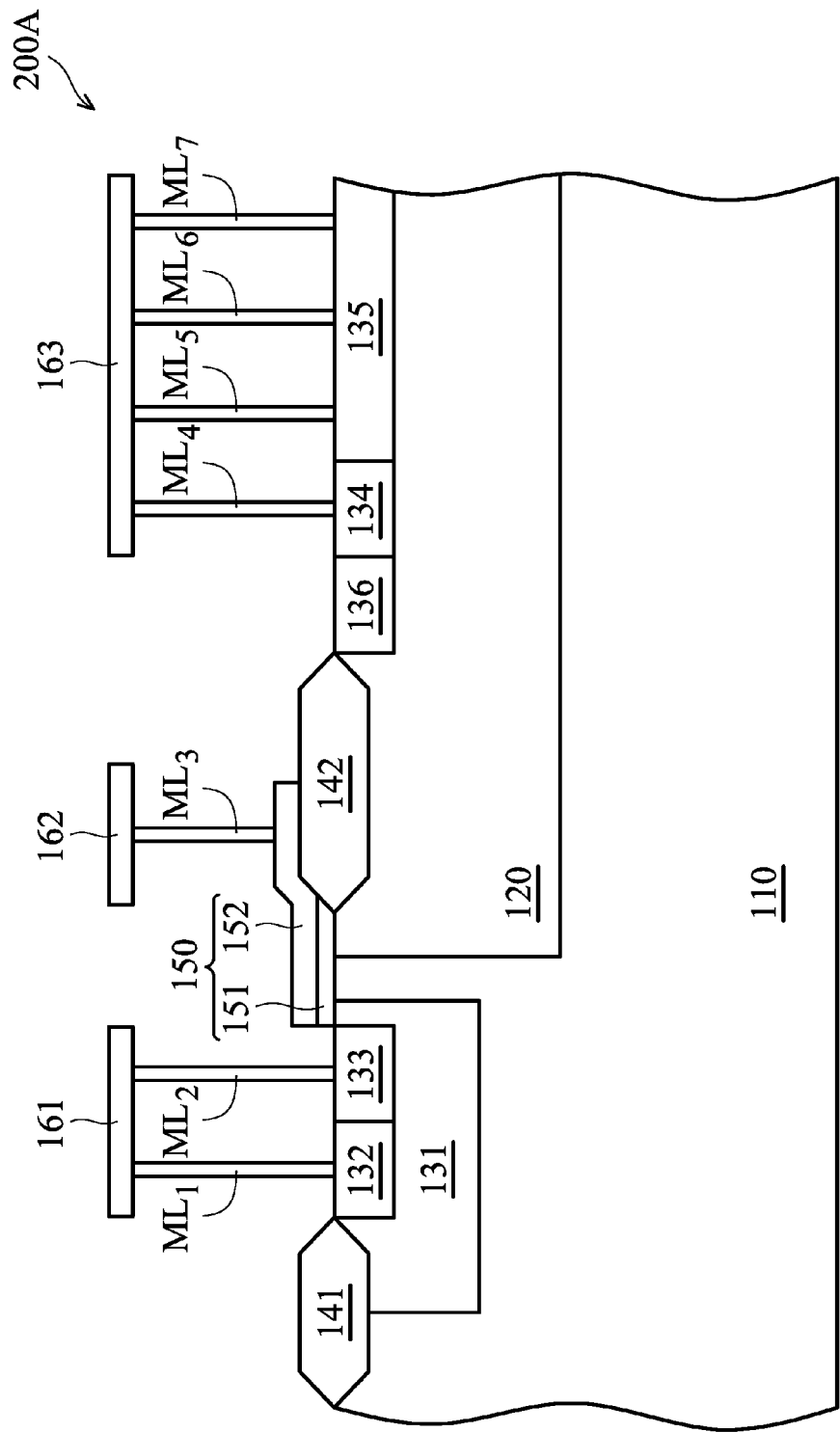
FIGS. 2A-2D are schematic diagrams of exemplary embodiments of the high-voltage semiconductor structure, according to various aspects of the present disclosure.

FIGS. 2A-2D are schematic diagrams of exemplary embodiments of the high-voltage semiconductor structure, according to various aspects of the present disclosure. FIG. 2A is similar to FIG. 1 except that the high-voltage semiconductor structure 200A further comprises a doped region 136. The doped region 136 has the second conductive type and is formed between the insulating layer 142 and the doped region 134. In one embodiment, the doped region 136 is formed by doping P-type dopants to serve as a P+ doped region or formed by doping N-type dopants to serve as an N+ doped region. In this embodiment, the doped region 136 does not electrically connect to the power line 163. The breakdown voltage of the IGBT constituted by the doped regions 132 and 134 and the gate electrode 152 can be improved due to the doped region 136.

Figure 2B:
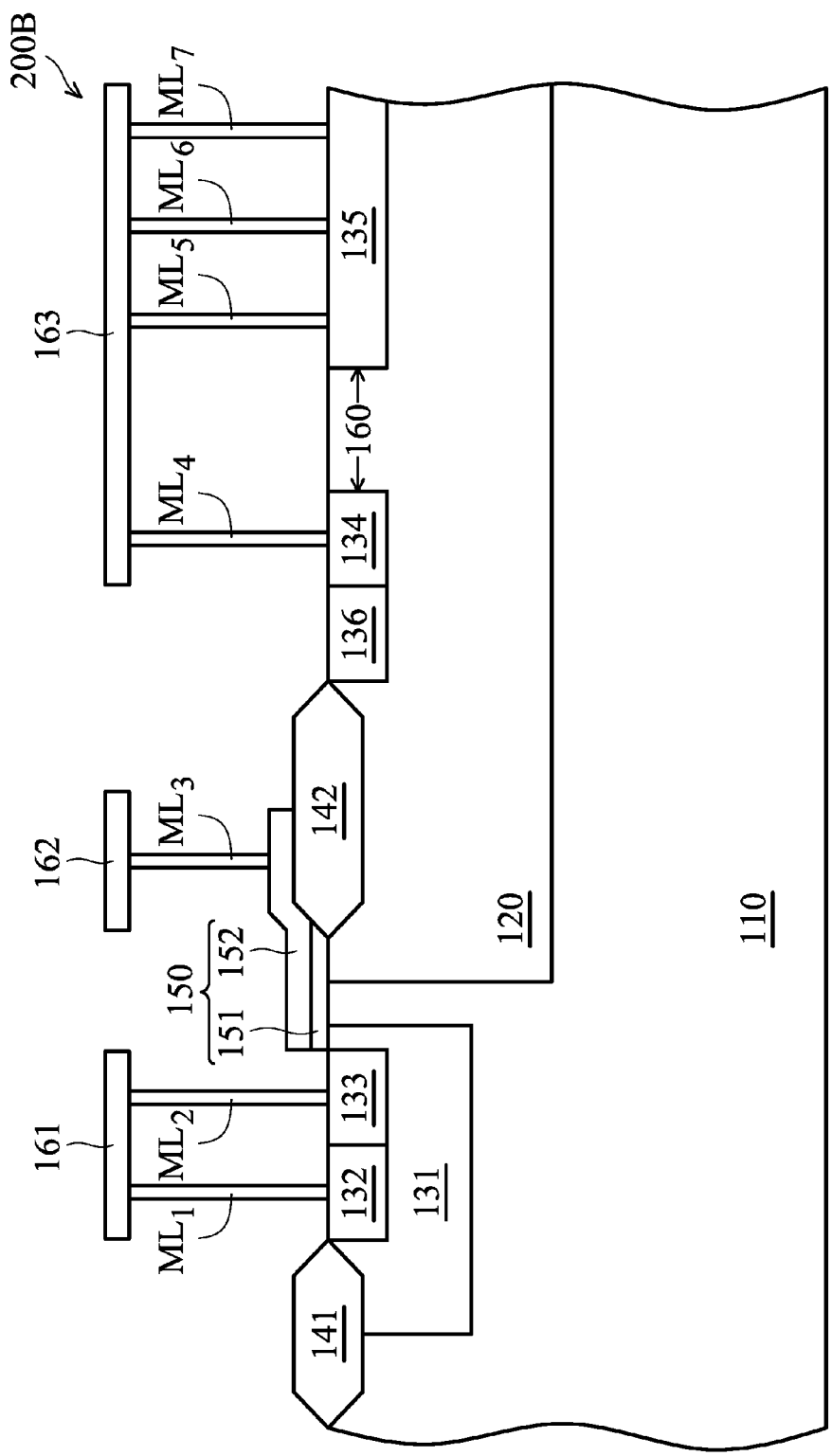

FIG. 2B is similar to FIG. 2A with the exception that the high-voltage semiconductor structure 200B further comprises a gap 160. The gap 160 is formed between the doped regions 134 and 135 to separate the doped regions 134 and 135. Since the gap 160 is formed between the doped regions 134 and 135, the current flowing through the doped region 134 and entering the power line 163 is increased. Therefore, the voltage difference between the doped region 134 and the well 120 is increased such that the IGBT constituted by the doped regions 132 and 134 and the gate electrode 152 is quickly triggered. In this embodiment, the distance (i.e. the width of the gap 160) between the doped regions 134 and 135 influences the trigger voltage of the IGBT. In some embodiments, the gap 160 is disposed between the doped regions 134 and 135 of the high-voltage semiconductor structure 100 shown in FIG. 1.

Figure 2C:
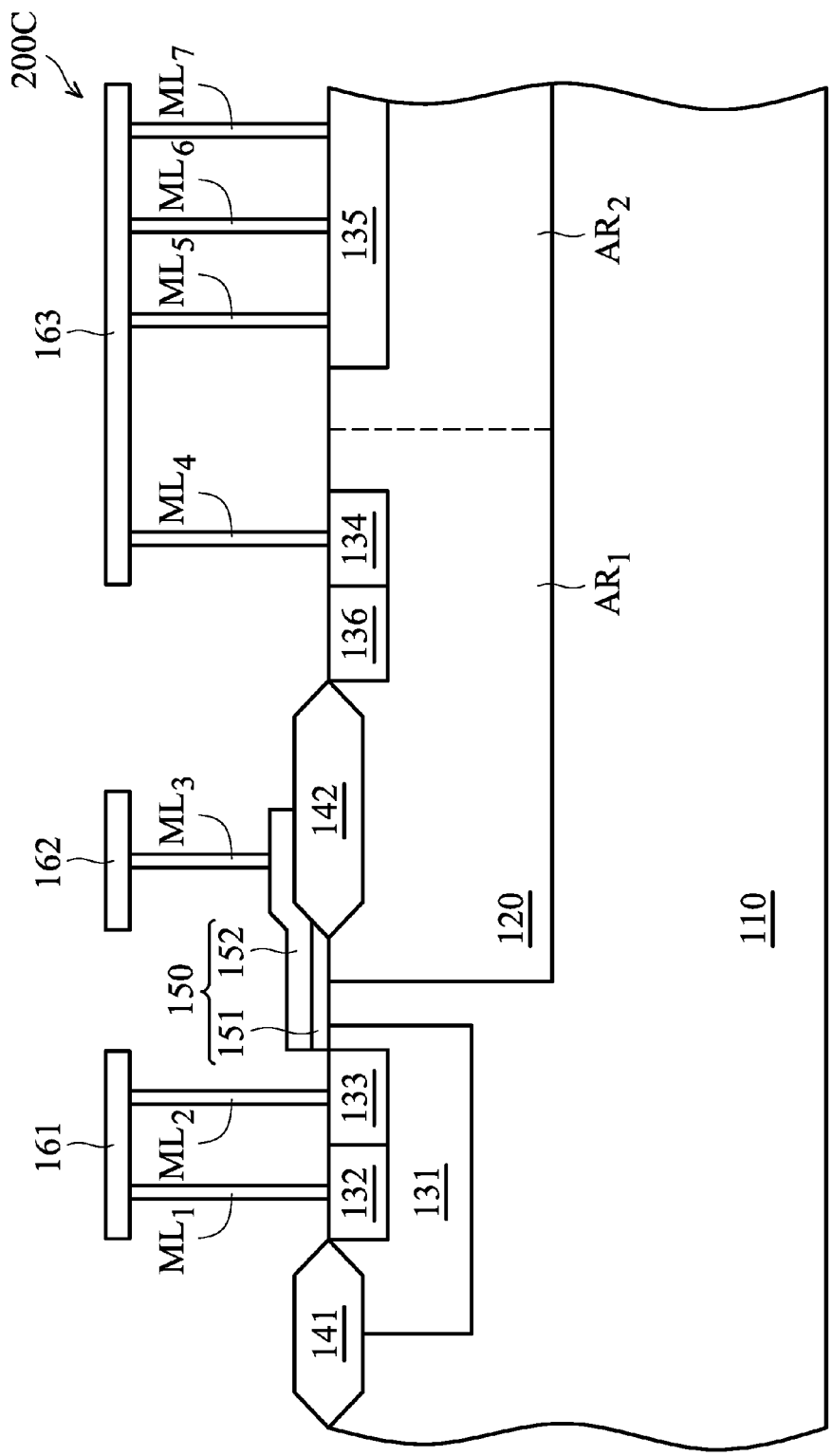

FIG. 2C is similar to FIG. 2B with the exception that the well 120 of the high-voltage semiconductor structure 200C is divided into regions $AR_1$ and $AR_2$. The doped region 135 is completely formed in the region $AR_2$. The doped region 134 is completely formed in the region $AR_1$. In this embodiment, the dopant concentration of the region $AR_1$ is higher than the dopant concentration of the region $AR_2$. In one embodiment, the region $AR_1$ is formed by doping dopants with the second conductive type, and the region $AR_2$ is not doped by any dopants. Since the region $AR_1$ and the doped region 135 are doped by the dopants with the second conductive type and the dopants diffuse to the region $AR_2$, the region $AR_2$ also has the dopants with the second conductive type. In this case, the dopant concentration of the region $AR_2$ is lower than the dopant concentration of the region $AR_1$.

Since the dopant concentration of the region $AR_2$ is lower than the dopant concentration of the region $AR_1$, the equivalent impedance of the region $AR_2$ is higher than the equivalent impedance of the region $AR_1$. Since the voltage level of the region $AR_2$ is higher than the voltage level of the region $AR_1$, the voltage difference between the doped region 134 and the well 120 is increased. Therefore, the IGBT is quickly turned on.

Figure 2D:
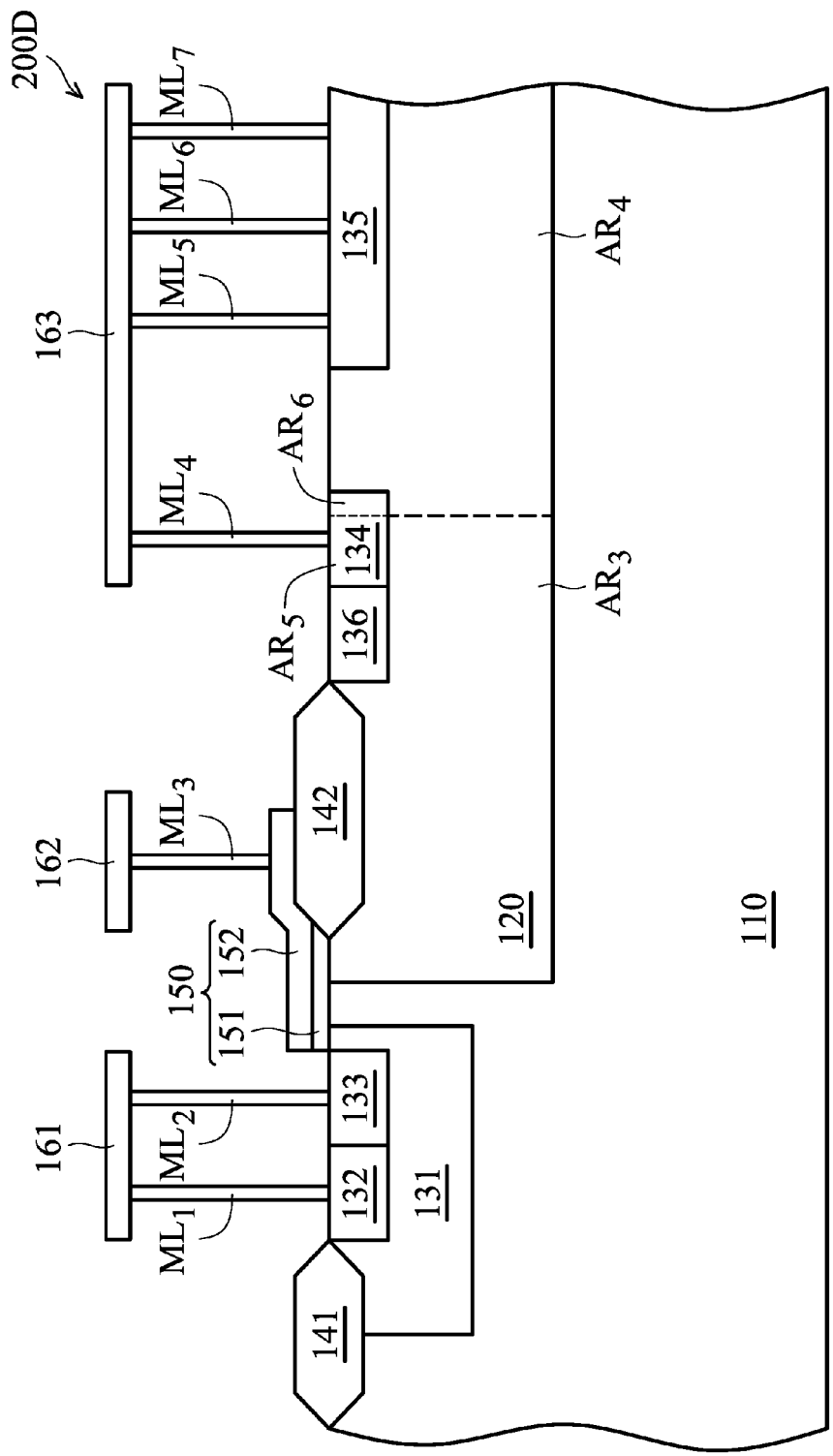

FIG. 2D is similar to FIG. 2C except that the region $AR_3$ of the well 120 of the high-voltage semiconductor structure 200D contains a portion of the doped region 134, and the region $AR_4$ contains the other portion of the doped region 134. For example, the doped region 134 comprises regions $AR_5$ and $AR_6$. The region $AR_5$ is disposed in the region $AR_3$ of the well 120. The region $AR_6$ is disposed in the region $AR_4$ of the well 120.

In this embodiment, the dopant concentration of the region $AR_3$ is higher than the dopant concentration of the region $AR_4$. Therefore, the equivalent impedance of the region $AR_4$ is higher than the equivalent impedance of the region $AR_3$ such that the voltage level of the region $AR_4$ is higher than the voltage level of the region $AR_3$. Therefore, the voltage difference between the doped region 134 and the well 120 is increased such that the IGBT constituted by the doped regions 132 and 134 and the gate electrode 152 is quickly turned on.

Figure 3A:
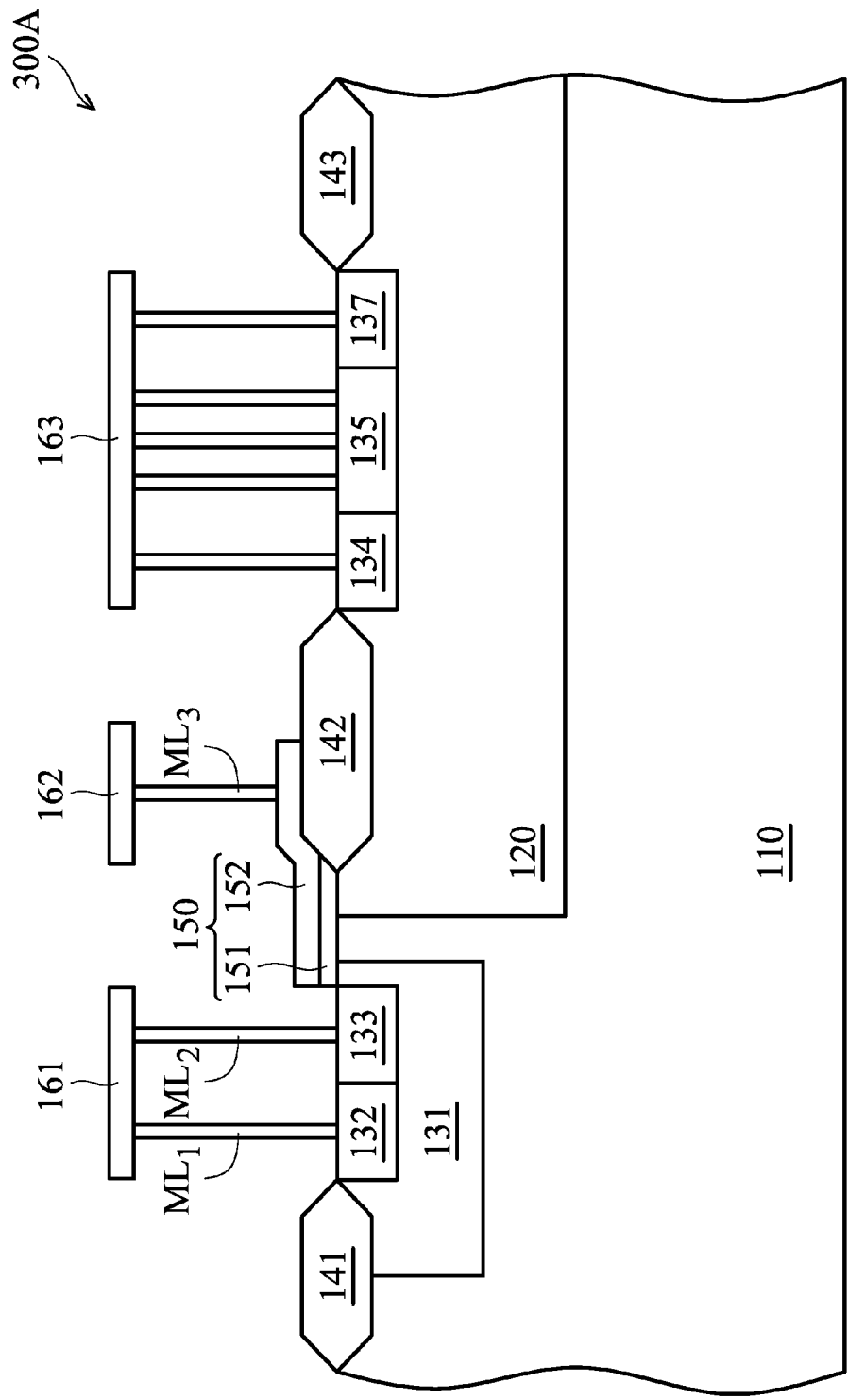
FIGS. 3A-3E are schematic diagrams of exemplary embodiments of the high-voltage semiconductor structure, according to various aspects of the present disclosure

FIGS. 3A-3E are schematic diagrams of exemplary embodiments of the high-voltage semiconductor structure, according to various aspects of the present disclosure. FIG. 3A is similar to FIG. 1 with the exception that the high-voltage semiconductor structure 300A further comprises a doped region 137. The doped region 137 has a first conductive type and is formed in the well 120. In this embodiment, the doped region 137 is electrically connected to the power line 163. In one embodiment, the doped regions 134 and 137 are the same doped region surrounded the doped region 135.

Figure 3B:
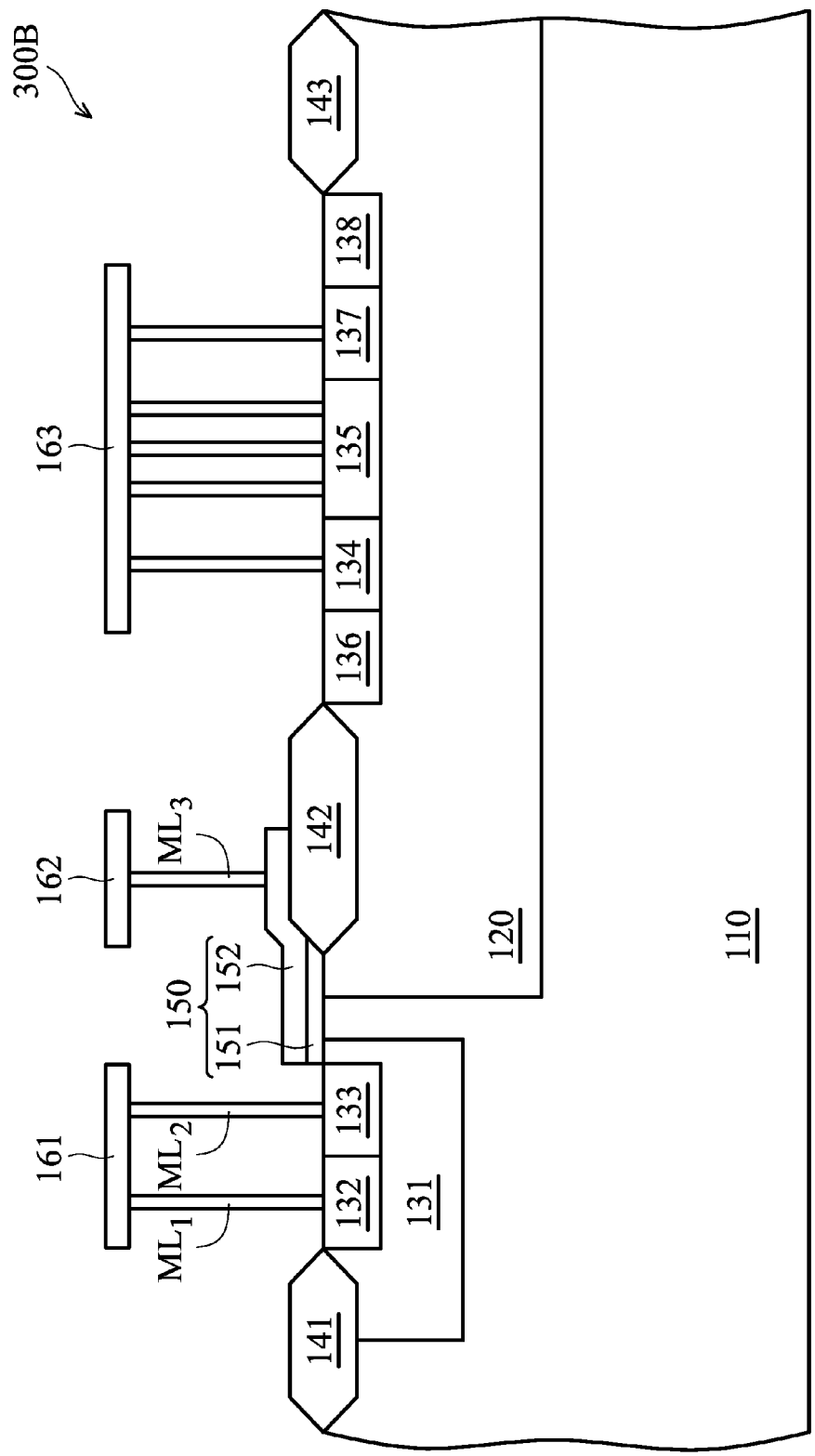

FIG. 3B is similar to FIG. 3A except that the high-voltage semiconductor structure 300B further comprises doped regions 136 and 138. Each of the doped regions 136 and 138 has the second conductive type. The doped region 136 is disposed between the insulating layer 142 and the doped region 134. The doped region 138 is disposed between the insulating layer 143 and the doped region 137. In this embodiment, the doped regions 136 and 138 are not electrically connected to the power line 163.

Figure 3C:
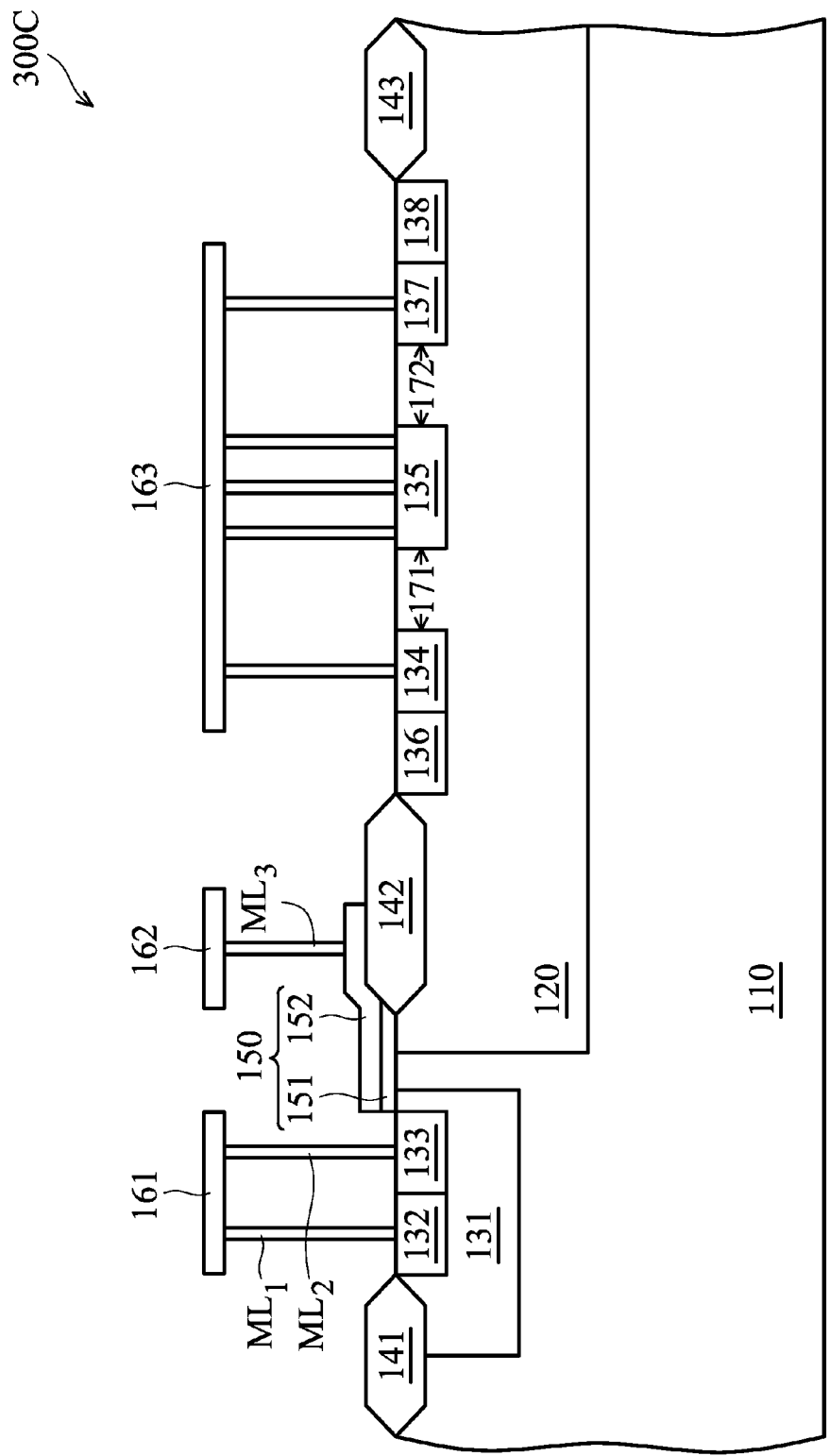

FIG. 3C is similar to FIG. 3B with the exception that the high-voltage semiconductor structure 300C further comprises gaps 171 and 172. The gap 171 is disposed between the doped regions 134 and 135 to separate the doped regions 134 and 135. The gap 172 is disposed between the doped regions 135 and 137 to separate the doped regions 135 and 137. Since the gap 171 is located between the doped regions 134 and 135, the current flowing through the doped region 134 is increased such that the PN junction between the doped region 134 and the well 120 is quickly turned on. Similarly, since the gap 172 is located between the doped regions 135 and 137, the current flowing through the doped region 137 is increased such that the PN junction between the doped region 137 and the well 120 is quickly turned on. The invention does not limit the widths of gaps 171 and 172. The width of the gap 171 may be the same as or different from the width of the gap 172.

Figure 3D:
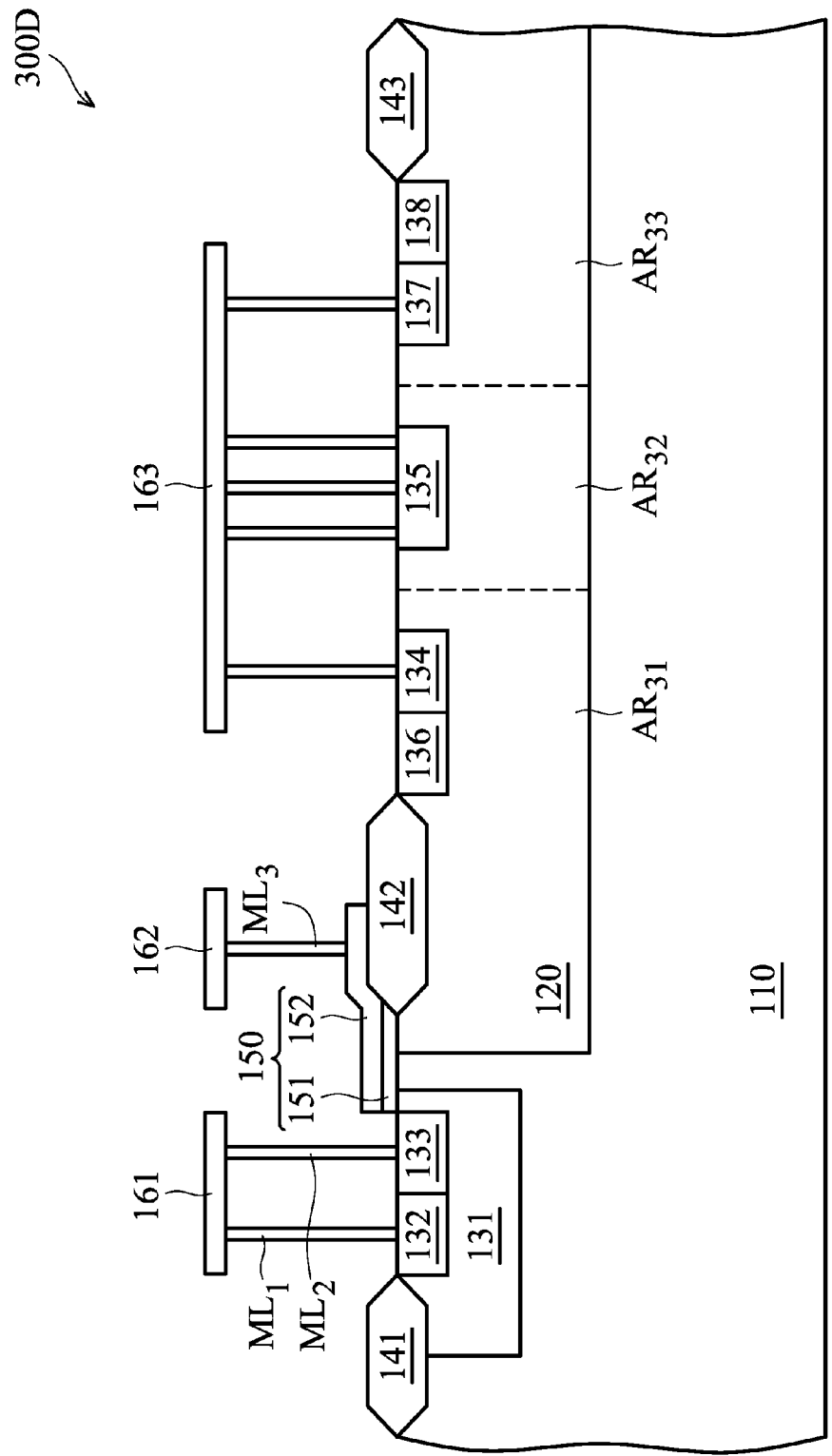

FIG. 3D is similar to FIG. 3C except that the well 120 of the high-voltage semiconductor structure 300D is divided into regions $AR_{31}$~$AR_{33}$. In this embodiment, the dopant concentration of the region $AR_{31}$ is similar to the dopant concentration of the region $AR_{33}$. The dopant concentration of the region $AR_{31}$ or $AR_{33}$ is higher than the dopant concentration of the region $AR_{32}$. In one embodiment, the region $AR_{32}$ does not dope any dopants. Since the dopants of the regions $AR_{31}$ and $AR_{33}$ and the doped region 135 diffuse into the region $AR_{32}$, the region $AR_{32}$ has the dopants with the second conductive type. In this embodiment, the doped region 135 is completely disposed in the region $AR_{32}$. The doped regions 136 and 134 are completely disposed in the region $AR_{31}$. The doped regions 137 and 138 are completely disposed in the region $AR_{33}$.

Figure 3E:
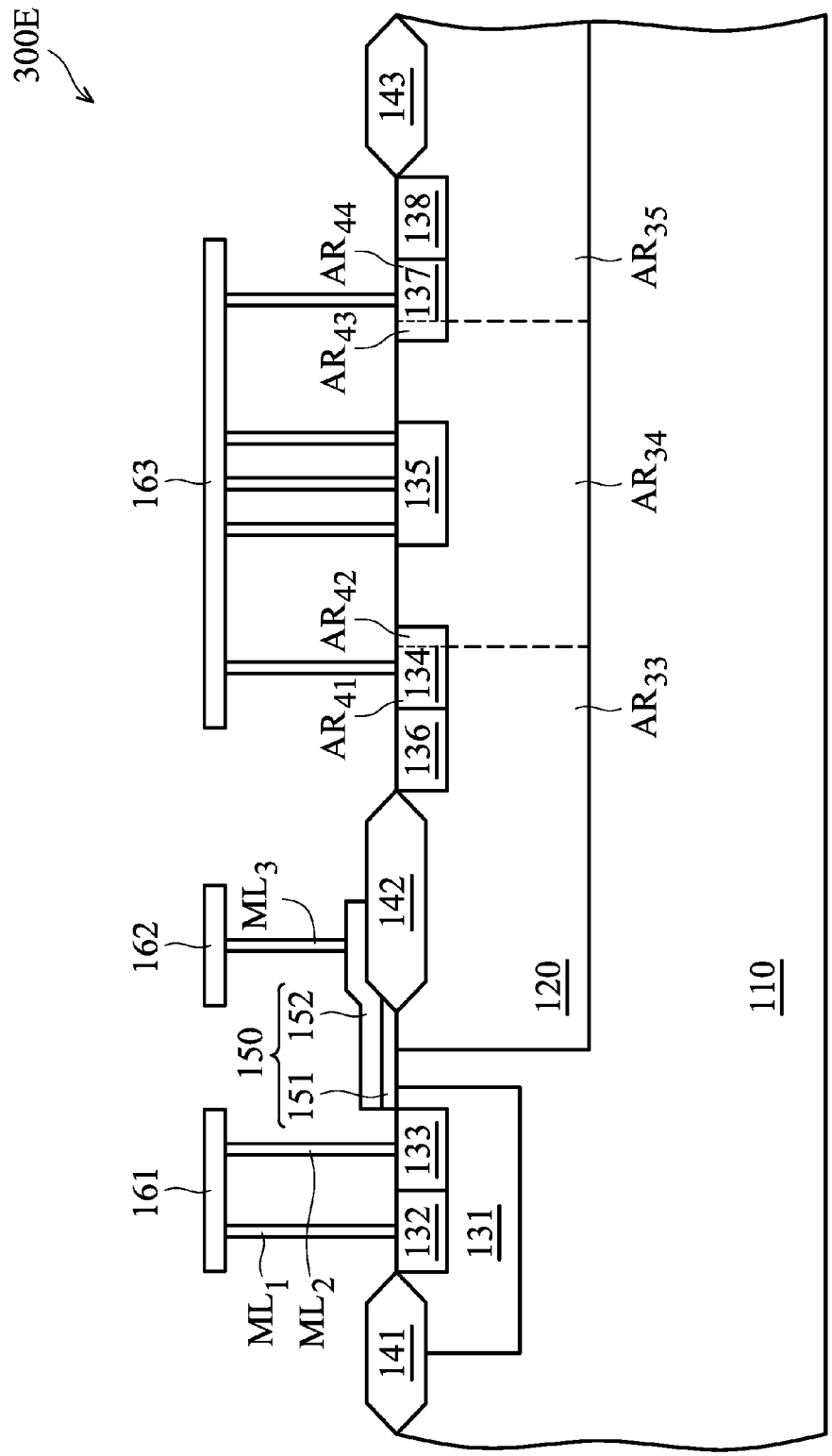

FIG. 3E is similar to FIG. 3D with the exception that the well 120 shown in FIG. 3E comprises regions $AR_{33}$~$AR_{35}$. The dopant concentration of the region $AR_{33}$ is similar to the dopant concentration of the region $AR_{35}$. The dopant concentration of the region $AR_{33}$ or $AR_{35}$ is higher than the dopant concentration of the region $AR_{34}$. In this embodiment, the doped region 134 is divided into regions $AR_{41}$~$AR_{42}$, and the doped region 137 is divided regions $AR_{43}$~$AR_{44}$. The region $AR_{41}$ is disposed in the region $AR_{33}$. The regions $AR_{42}$ and $AR_{43}$ are disposed in the region $AR_{34}$. The region $AR_{44}$ is disposed in the region $AR_{35}$.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage semiconductor structure, comprising:
a substrate having a first conductive type;
a first doped region having the first conductive type and formed in the substrate;
a well having a second conductive type and formed in the substrate;
a second doped region having the second conductive type and formed in the first doped region;
a third doped region having the first conductive type and formed in the well;
a fourth doped region having the second conductive type and formed in the well; and
a gate structure disposed over the substrate and partially covering the first doped region and the well,
wherein the well comprises a first region and a second region, a dopant concentration of the first region is higher than a dopant concentration of the second region, and the fourth doped region is disposed in the second region;
wherein the third doped region comprises a third region and a fourth region, the third region is disposed in the first region, and the fourth region is disposed in the second region.

2. The high-voltage semiconductor structure as claimed in claim 1, wherein the first conductive type is P-type, and the second conductive type is N-type.

3. The high-voltage semiconductor structure as claimed in claim 1, wherein the first conductive type is N-type, and the second conductive type is P-type.

4. The high-voltage semiconductor structure as claimed in claim 1, further comprising:
   a fifth doped region having the second conductive type and formed between an insulating layer and the third doped region.

5. The high-voltage semiconductor structure as claimed in claim 4, wherein the insulating layer is location between the second and fifth doped regions.

6. The high-voltage semiconductor structure as claimed in claim 5, further comprising:
   a plurality of metal conductive lines configured to electrically connect to the third and fourth doped regions.

7. The high-voltage semiconductor structure as claimed in claim 5, further comprising:
   a gap formed between the third and fourth doped regions to separate the third and fourth doped regions.

8. The high-voltage semiconductor structure as claimed in claim 1, wherein the third doped region is disposed in the first region.

9. The high-voltage semiconductor structure as claimed in claim 1, further comprising:
   a gap formed between the third and fourth doped regions to separate the third and fourth doped regions.

10. The high-voltage semiconductor structure as claimed in claim 1, further comprising:
    a sixth doped region having the first conductive type and formed in the well.

11. The high-voltage semiconductor structure as claimed in claim 10, further comprising:
    a first gap disposed between the third and fourth doped regions; and
    a second gap disposed between the fourth and sixth doped regions.

12. The high-voltage semiconductor structure as claimed in claim 11, wherein the well further comprises a dopant concentration of the third region is higher than the dopant concentration of the second region, the third doped region is completely disposed in the first region, and the sixth doped region is completely disposed in the third region.

13. The high-voltage semiconductor structure as claimed in claim 12, wherein the third doped region comprises a fourth region and a fifth region, the sixth doped region comprises a sixth region and a seventh region, the fourth region is disposed in the first region, the fifth and seventh region are disposed in the second region, and the sixth region is disposed in the third region.

14. The high-voltage semiconductor structure as claimed in claim 11, further comprising:
    a seventh doped region having the second conductive type and formed between a first insulating layer and the third doped region; and
    an eighth doped region having the second conductive type and formed between a second insulating layer and the sixth doped region.

* * * * *